(12) United States Patent
Wang et al.

(10) Patent No.: US 9,667,306 B2
(45) Date of Patent: May 30, 2017

(54) MULTIMODE MULTIBAND WIRELESS DEVICE WITH BROADBAND POWER AMPLIFIER

(76) Inventors: Adam James Wang, Palo Alto, CA (US); Zlatko Aurelio Filipovic, Palo Alto, CA (US)

(*) Notice: Subject to any disclaimer, the term of this patent is extended or adjusted under 35 U.S.C. 154(b) by 972 days.

(21) Appl. No.: 13/282,449

(22) Filed: Oct. 26, 2011

(65) Prior Publication Data

US 2013/0109433 A1 May 2, 2013

(51) Int. Cl.
*H04M 1/00* (2006.01)
*H04B 1/525* (2015.01)

(52) U.S. Cl.
CPC .................................. *H04B 1/525* (2013.01)

(58) Field of Classification Search
CPC . H04W 48/04; H04W 52/283; H04W 52/246; H04W 52/26; H04W 52/265; H04W 72/0453; H04W 72/082; H04W 88/02; H04B 2203/5416; H04B 3/542; H04B 7/0602; H04B 1/0053; H04B 1/006; H04B 1/0458; H04B 1/0475; H04B 1/10; H04B 1/1027; H04B 1/16; H04B 7/0404; H04N 5/40; H04N 7/20; H04N 21/41407; H04N 21/6112; H04N 21/6131; H04N 21/64315; H04N 5/455; H04H 20/57; H04H 20/72; H04H 60/91

USPC .............. 455/552.1, 41.1, 304, 73
See application file for complete search history.

(56) References Cited

U.S. PATENT DOCUMENTS

| | | | | |
|---|---|---|---|---|
| 3,903,485 | A * | 9/1975 | Dolby | 333/14 |
| 4,422,047 | A * | 12/1983 | Wright | 330/51 |
| 4,539,566 | A * | 9/1985 | Sharpe et al. | 342/389 |
| 4,987,605 | A * | 1/1991 | Nose | 455/161.2 |
| 5,694,414 | A * | 12/1997 | Smith et al. | 375/130 |
| 6,118,991 | A * | 9/2000 | Jean et al. | 455/293 |
| 6,449,264 | B1 * | 9/2002 | Lehtinen et al. | 370/328 |
| 2007/0243832 | A1 * | 10/2007 | Park et al. | 455/73 |
| 2008/0062856 | A1 * | 3/2008 | Feher | 370/206 |
| 2009/0068974 | A1 * | 3/2009 | Smith | 455/304 |
| 2009/0213768 | A1 * | 8/2009 | Jeong et al. | 370/280 |
| 2010/0117738 | A1 * | 5/2010 | Korden | H03F 1/0261 330/277 |
| 2011/0057730 | A1 * | 3/2011 | Makioka et al. | 330/295 |
| 2012/0128167 | A1 * | 5/2012 | Tanaka | 381/58 |

* cited by examiner

*Primary Examiner* — Nimesh Patel
(74) *Attorney, Agent, or Firm* — Roark IP

(57) ABSTRACT

A multimode multiband wireless device includes a broadband RF power amplifier that receives RF signals and produces amplified RF signals in a cellular band in a broadband, and a coexist filter coupled to the input of the broadband RF power amplifier. The coexist filter can reject RF noise in a predetermined frequency range in the broadband adjacent to the cellular band.

12 Claims, 21 Drawing Sheets

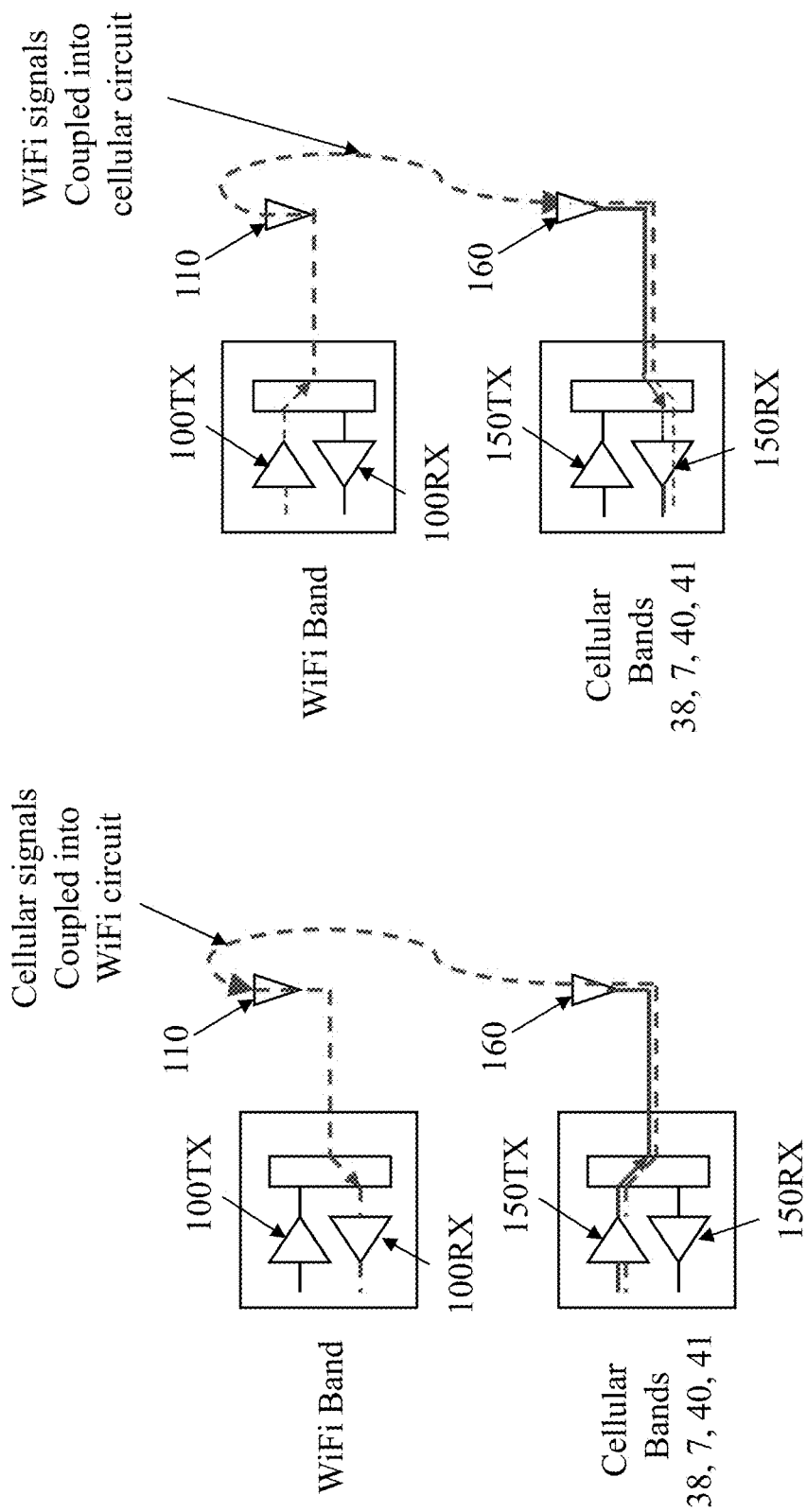

MULTIMODE MULTIBAND WIRELESS DEVICE WITH BROADBAND POWER AMPLIFIER

BACKGROUND OF THE INVENTION

The present invention relates to wireless communication technologies, and in particular, to multimode multiband wireless devices.

In modern wireless communications, wireless signals transmitted by mobile devices are regulated in frequency bands defined in various standards and protocols. For example, Universal Mobile Telecommunications System (UMTS) and evolved UMTS Terrestrial Radio Access (E-UTRA) define many of these cellular bands for mobile communications, as shown in FIGS. 1A-1D. Different cellular bands typically utilize different amplifiers, which require multiple power amplifiers in a multi-band wireless device. The proliferation of cellular bands has increased the number of power amplifiers, and thus the costs and sizes of the wireless devices.

A serious challenge to mobile RF communications is that wireless devices services operate in multiple bands that can interfere with each other and with other wireless services. Examples of other wireless services include WiFi, global positioning system (GPS), satellite digital audio radio (SDARS), digital terrestrial television (DTV), digital video broadcasting (DTB), FM radio, NFC, navigation, and other satellite and terrestrial broadcast services. Many of these services operate immediately adjacent to cellular bands. These other wireless services can generate noises that interfere with mobile RF communications. Moreover, many mobile communication devices provide functions in cellular communications as well as many of these other wireless services. For example, many smart phones can provide mobile RF communications, and also include functionalities for WiFi, Bluetooth, GPS, DTV, FM radio, NFC and other satellite or terrestrial broadcasting and communication services.

In cellular communications, uplink means transmission from terminals to base stations. Downlink means reception from terminals to base stations. There are two types of duplexing for uplink and downlink: frequency-division duplexing (FDD) and time-division duplexing (TDD). In FDD, uplink and downlink use different frequencies. In TDD, uplink and downlink use the same frequency. In this application, the uplink frequencies are used for FDD bands as illustrative examples.

In the 2.3 GHz to 2.7 GHz frequency range, as shown in FIG. 1A, cellular bands and the WiFi coexist in close frequency range. Specifically, Band 38 (2.570-2.620 GHz), Band 7 (2.500-2.570 GHz), Band 40 (2.300-2.400 GHz), and Band 41 (2.496-2.690 GHz) are very close to the WiFi band (2.400-2.483 GHz) and SDARS band (2.320-2.345 GHz). As shown in FIG. 2A, the RF signals in the cellular Bands 38, 7, 40, 41 amplified by a cellular transmission amplifier 150TX and transmitted by antenna 160 are often coupled into an antenna 110 and an amplifier 100RX in a WiFi receiver, which creates too much noise for the WiFi receiver. Conversely, as shown in FIG. 2B, WiFi signals amplified by the transmission amplifier 100TX and transmitted by the antenna 110 can be coupled into the antenna 160 and the amplifier 150RX in the cellular band circuit, which interferes with the reception of the RF signals in the cellular Bands 38, 7, 40, 41. The interferences between the WiFi band and the cellular bands can prevent mobile devices from simultaneously operating in a cellular network and a wireless local network (WLAN).

Similarly, in the 0.7-1.5 GHz range, as shown in FIG. 1B, DTV CH 51, 52 are right next to cellular bands 12, 17. The noises from these cellular bands circuit can significant affect the reception of DTV signals. Additionally, in the 1.5-2.0 GHz range, as shown in FIG. 1C, GPS frequency (1.575 GHz) is overlap with cellular band 24 downlink frequency (1.525-1.559 GHz). The noises from cellular band can significant affect the reception of GPS signals. There is therefore a need to provide RF signal amplification spanning multiple cellular bands without increasing the number of power amplifiers, device size, and cost. There is also a need to provide wireless communications simultaneously with wireless services such as WiFi, GPS, SDARS, DTV, digital terrestrial television (DTV), FM radio, NFC, satellite navigation, and satellite broadcast.

SUMMARY OF THE INVENTION

The present invention provides RF wireless communications in frequency ranges also operated by other wireless services such as WiFi, GPS, satellite music, FM radio, digital terrestrial television, digital video broadcasting, navigation, SDARS, DTV, and NFC, etc. The disclosed power amplifying circuit can enable a wireless device to simultaneously communicate in cellular network and perform the other wireless services.

The present invention provides RF power amplification in multiple cellular bands, with reduced number of power amplifiers and reduced costs comparing to conventional power amplifier circuit.

In some implementations, the use of notch filters decreases the number of high Q band pass filters, which also simplifies the power amplifying circuit and reduces costs. A new RF front-end design is also disclosed to further decrease size. The reduction of components in the presently disclosed power amplifier circuits allows higher level of integration and higher level of device miniaturization in wireless devices.

The disclosed broadband linear amplifier circuits are suitable to various wireless communications protocols, such as 3G, 4G, Long Term Evolution (LTE), LTE Advanced, WiMax, WiBro, WiFi, and WLAN.

In a general aspect, the present invention relates to a multimode multiband wireless device that includes an RF power amplifier that receives RF signals and produces amplified RF signals in a cellular band in a broadband, and a coexist filter coupled to the RF power amplifier. The coexist filter can reject RF noise in a predetermined frequency range in the broadband adjacent to the cellular band.

In a general aspect, the present invention relates to a multimode multiband wireless device that includes one or more input terminals each configured to receive an input RF signal; one or more input coexist filters each configured to pass through one of RF signals in a cellular band and reject RF noise outside of the cellular band; a broadband RF power amplifier that can receive RF signals from the one or more input coexist filters or directly from the one or more input terminals and to produce amplified RF signals; one or more output coexist filters each configured to pass through amplified RF signals in a cellular band and reject RF noise outside of the cellular band; and one or more output terminals each configured to receive one of the amplified RF signal from the one or more output coexist filters or directly from the broadband RF power amplifier.

BRIEF DESCRIPTION OF THE DRAWINGS

The following drawings, which are incorporated in and from a part of the specification, illustrate embodiments of the present specification and, together with the description, serve to explain the principles of the specification.

FIGS. 2A and 2B illustrate interferences between the WiFi band and the cellular bands in the 2.0-2.7 GHz range (shown in FIG. 1A) on a conventional wireless device.

DETAILED DESCRIPTION OF THE INVENTION

Figure 3A:
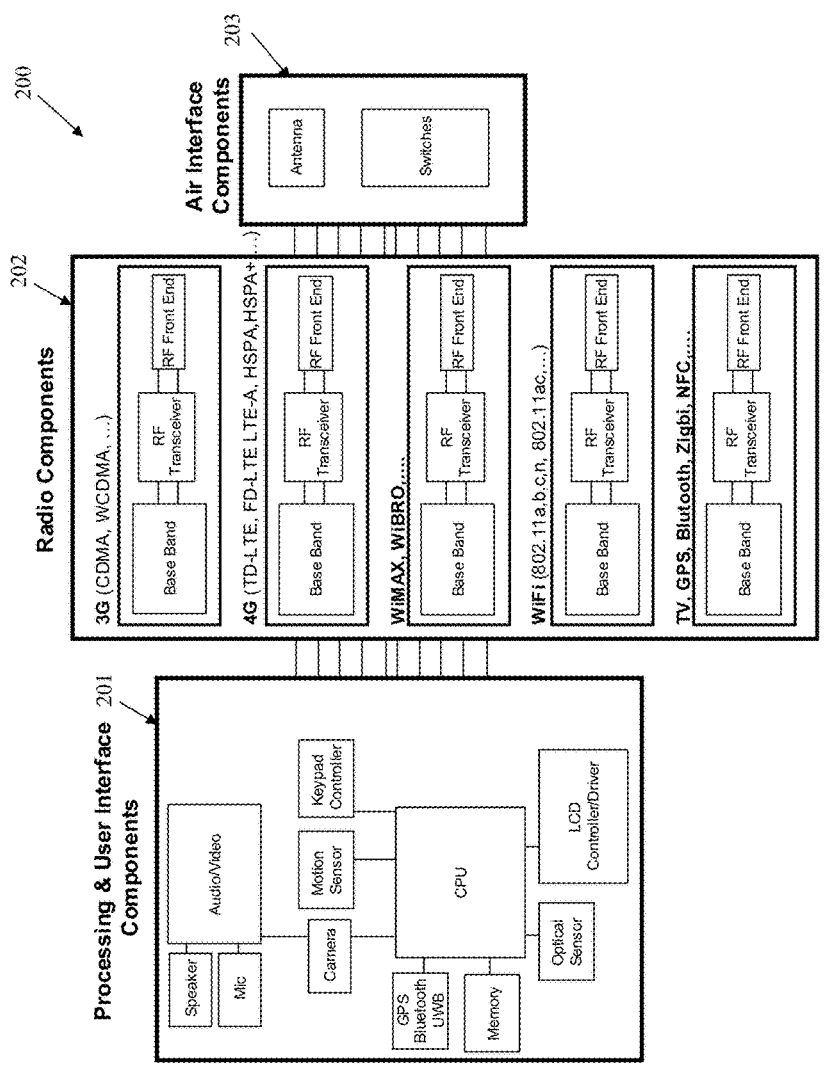
FIG. 3A is a system diagram of a multimode multiband wireless device.
Figure 3B:
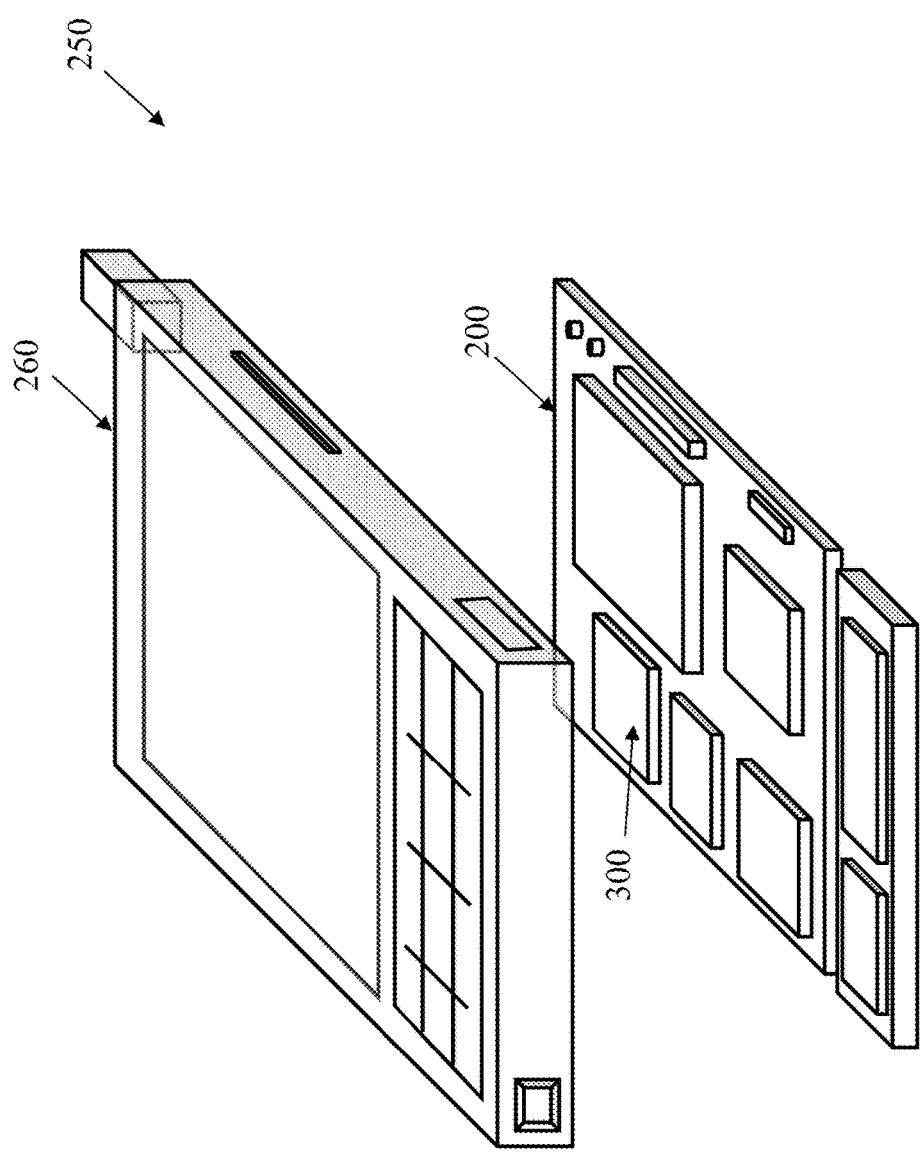
FIG. 3B is a schematic diagram of the multimode multiband wireless device in FIG. 3A.

Referring to FIGS. 3A and 3B, a multimode multiband wireless device 250 includes user interface 260 and multimode RF circuits 200 having receiving and/or transmitting capabilities for cellular phone and wireless services. For example, as shown in FIG. 3A, 3G, 4G, WiMax, Wi Bro, WiFi, DTV, SDARS, GPS, Bluetooth, Zigbi, NFC, FM radio can coexist as radio components 202 in the multimode multiband wireless device 250. The multimode RF circuits 200 can further include processing and user interface components 201 and air interface component 203.

The cellular phone can communicate in multiband frequencies such as defined by FIG. 1A-1D. In the present invention, the term "coexist" refers to cellular and other wireless services that can communicate in multimode multiband and do not interfere with each other in receiving and transmitting.

In the present specification, the term "broadband" refers to an RF frequency band that spans the frequency range of two or more cellular bands. The term "broadband amplifier" refers to an amplifier that can amplify RF signals in a wide frequency range covering multiple cellular bands. Therefore, a wireless device using broadband power amplifier can operate in multiple cellular bands.

Figure 3C:
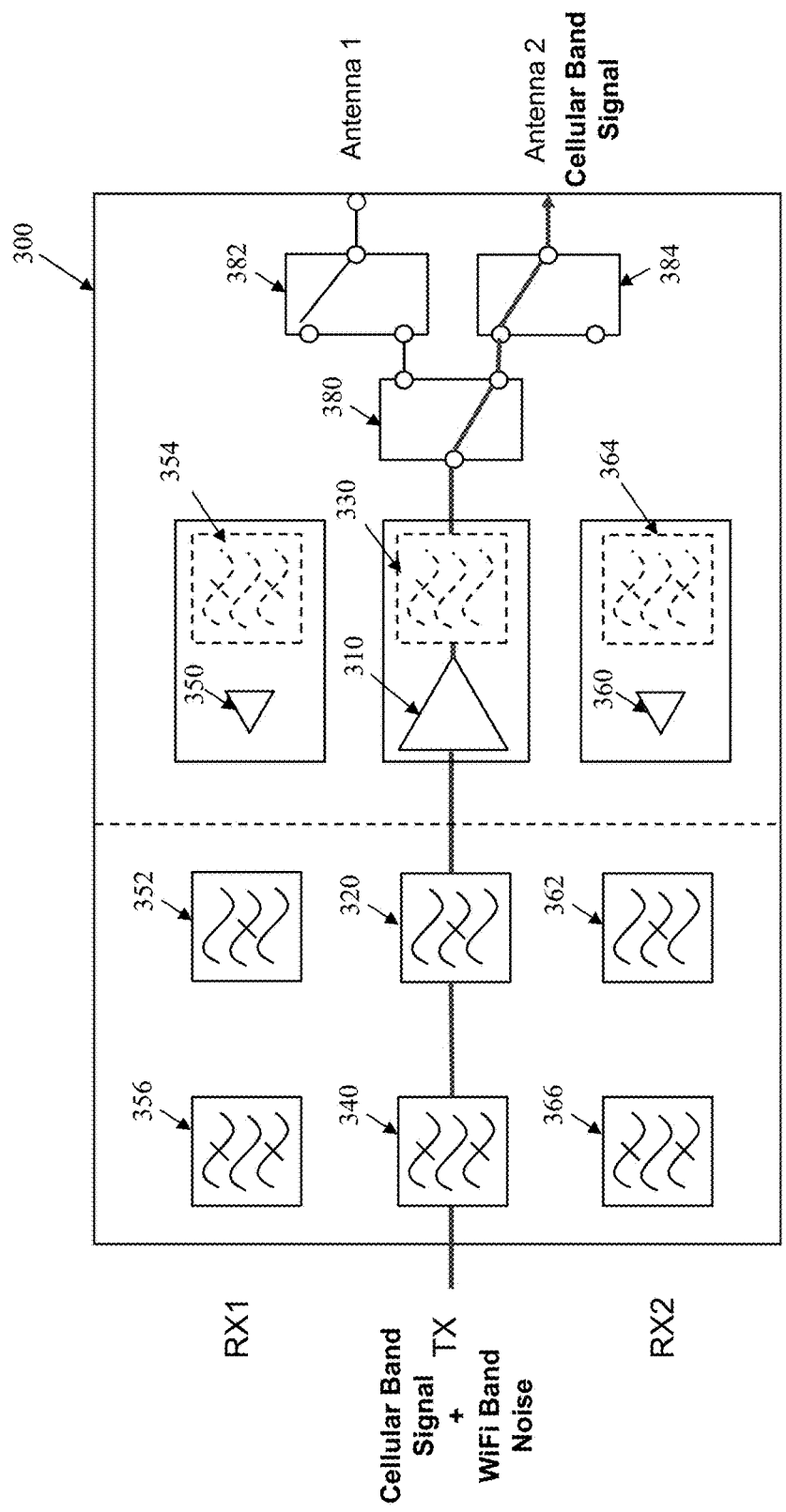
FIG. 3C shows the transmission of RF signals in by the RF amplifier circuit in a wireless device in accordance with the present invention.
Figure 3D:
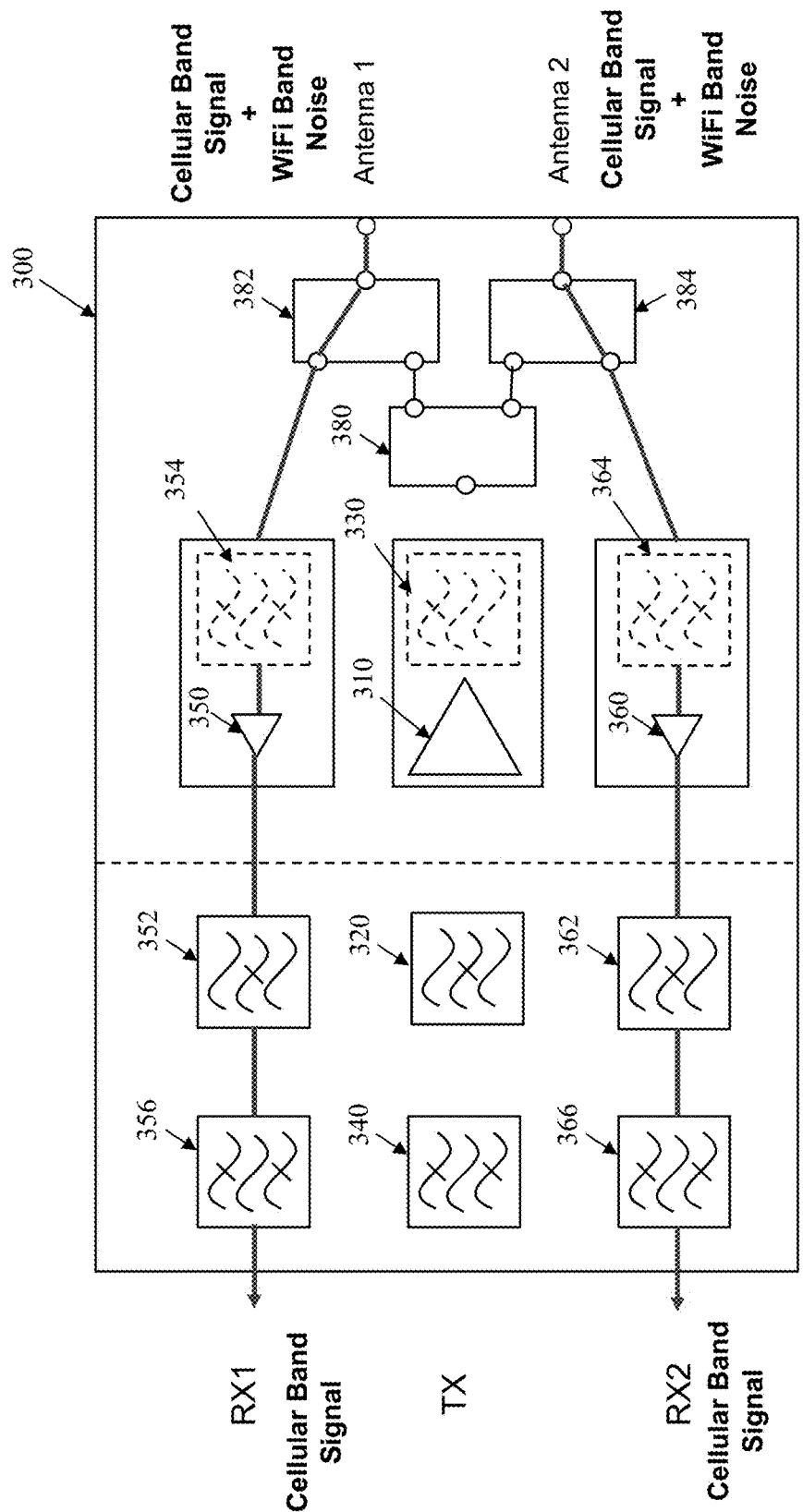
FIG. 3D shows the reception of RF signals in a wireless device circuit in accordance with the present invention.

Referring to FIGS. 3C and 3D, a multimode multiband wireless device 300 includes a transmission path (TX) and one or more reception paths (RX1, RX2). The transmission path includes a broadband power amplifier (PA) 310, a coexist filter 320, an antenna filer 330, and an interstage filter 340. A first reception path (RX1) includes a broadband amplifier 350 (i.e. low-noise amplifier), a coexist filter 352, an antenna filer 354, and an interstage filter 356. A second reception path (RX2) includes a broadband amplifier 360, a coexist filter 362, an antenna filer 364, and an interstage filter 366. In the RF front end near antennas, switches 380-384 form single input multiple output (SIMO), which are connected to antennas 1, 2, the output of the transmission path (TX), and the inputs of the reception paths (RX1, RX2).

The switches 380-384 can provide time-division duplex for the transmission path and the reception paths. The inter-stage filters 340, 356, 366 can either be balanced or unbalanced. These inter-stage filters can also be implemented with passive components such as inductors and or capacitors. The coexist filters 320, 352, and 362 can be implemented by notch filters or band-pass filters using high Q resonators such as SAW, BAW or FBAR, etc.

Figure 1A:
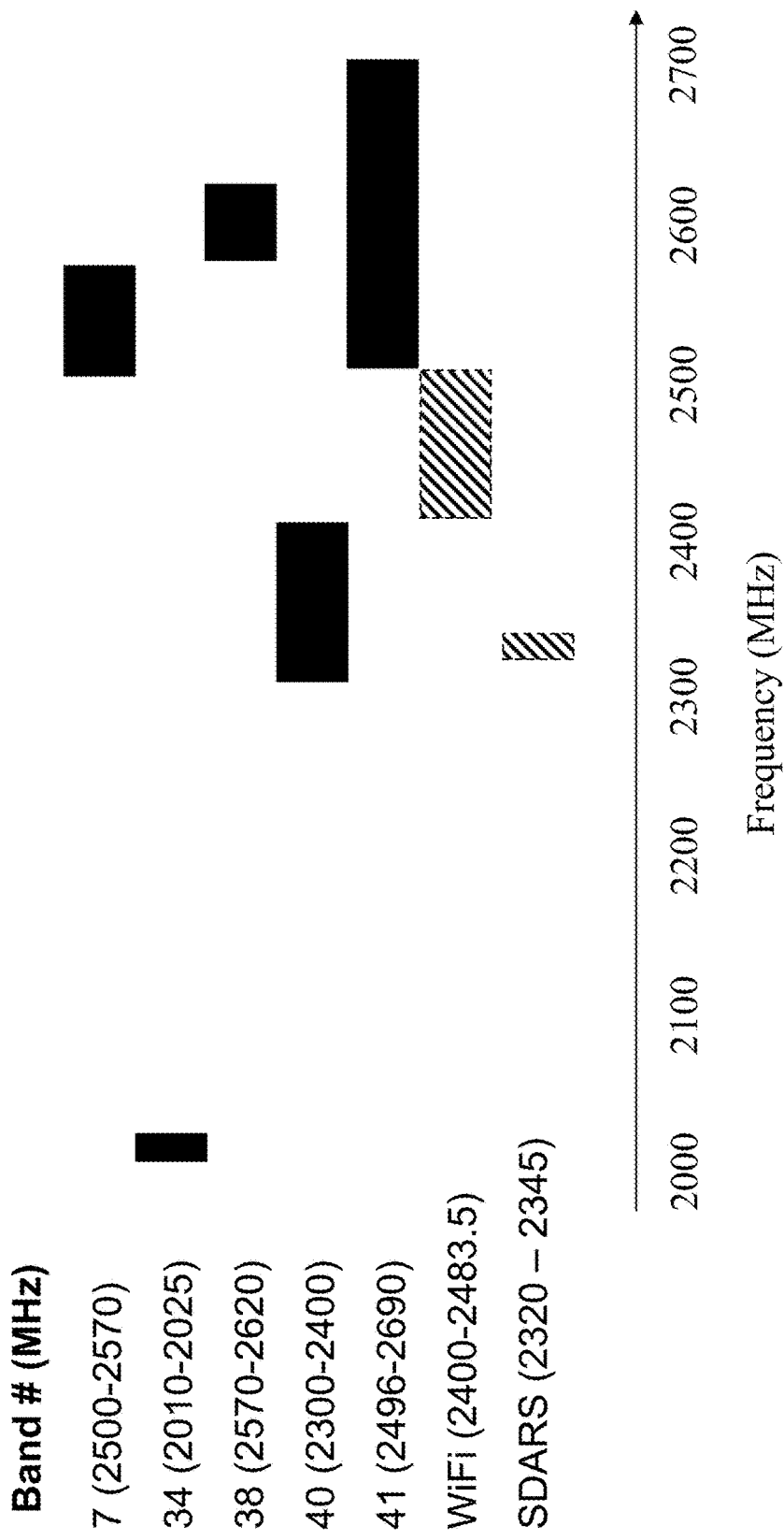
FIG. 1A is a schematic diagram illustrating the WiFi band and cellular bands uplink frequency in the 2.0-2.7 GHz range.
Figures 4A, 4B, 4C:
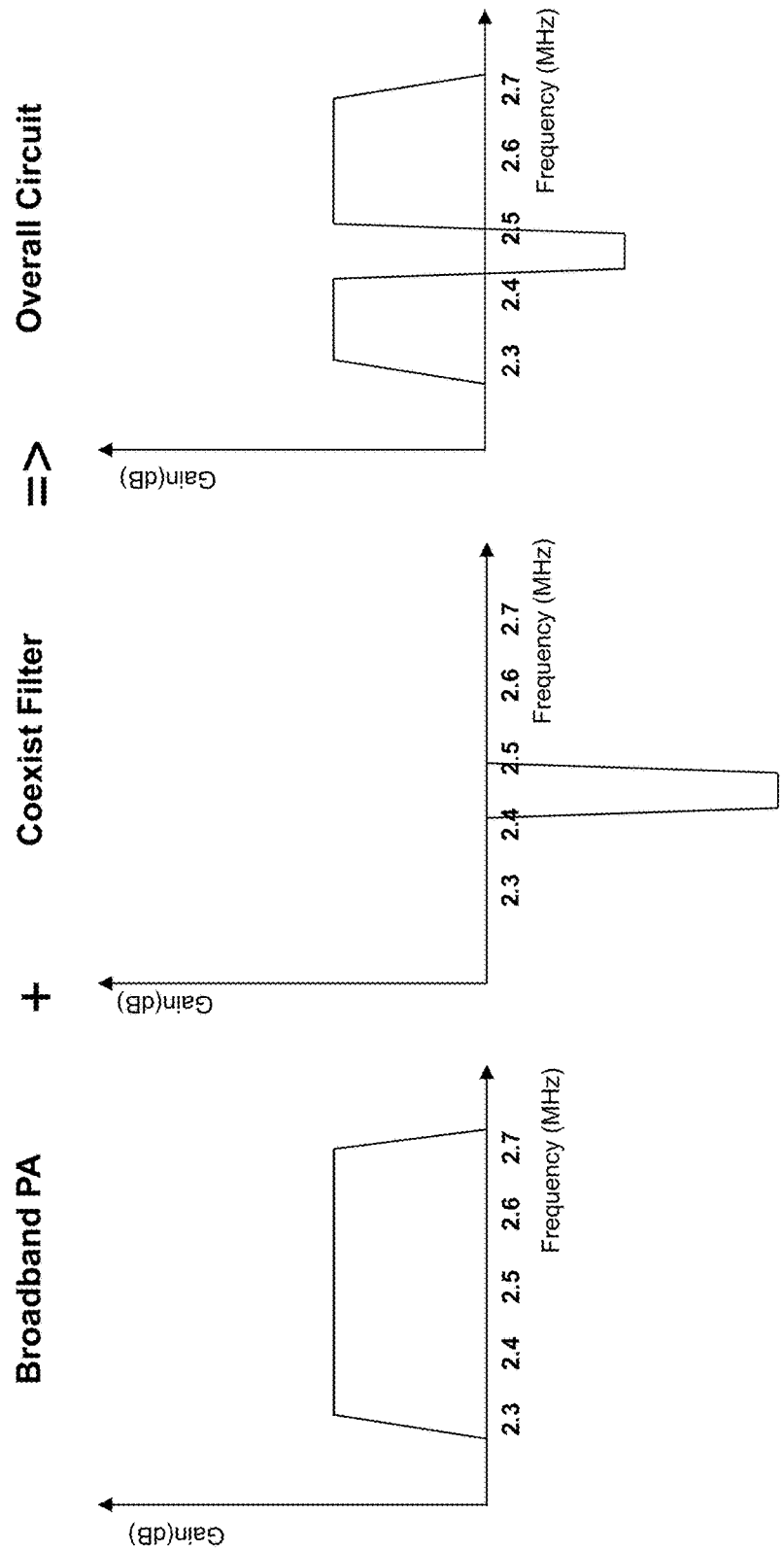
FIG. 4A shows an exemplified broadband PA gain profile of the transmission (TX) path in the amplifier circuit in FIG. 3C.
FIG. 4B shows the attenuation profile of the coexist filter in FIG. 3C.
FIG. 4C shows the overall gain profile of the transmission (TX) path in FIG. 3C.

In the transmission mode, the broadband power amplifier (PA) 310 has a broad gain profile spanning from 2.3 GHz to 2.7 GHz, as shown in FIG. 4A, which covers the range of multiple cellular Bands 7, 38, 40, 41, and the WiFi band shown in FIG. 1A. In some implementations, the broadband power amplifier 310 can have a broader gain profile spanning from 2.0 GHz to 2.7 GHz which also covers an additional Band 34. The overall bandwidth and gain profile of the broadband power amplifier 310 is affected by the characteristics of the antenna filer 330, but also the characteristics of the interstage filter 340.

The coexist filter 320, as shown in FIG. 4B, rejects RF noise in the frequency range of 2.4 GHz to 2.5 GHz, in which the WiFi band resides. The coexist filter 320 when implemented by a notch filter has sharp fall offs in the pass at 2.4 GHz and 2.5 GHz. The coexist filter can selectively attenuate noises in the WiFi band, which may be generated by the WiFi circuit or other sources. Referring to FIG. 3C, the interstage filter 340 receives and filters RF signals in a broadband spanning from 2.3 GHz to 2.7 GHz, which can include both cellular band signals and WiFi band noise. The coexist filter 320 filters the RF signal received from the interstage filter 340 and rejects the RF noise between 2.4 GHz and 2.5 GHz. The RF signals filtered by the coexist filter 320 is amplified by output by the broadband power amplifier 310 and further filtered by the antenna filter 330. The resulting amplified transmission RF signals only include cellular signals and are directed by the switches 390-384 to antenna 1, 2 for wireless transmission. The gain profile of the transmission path TX, shown in FIG. 4C, includes two bands with sharp attenuation edges. The coexist filter 320 can be implemented by a notch filter which can attenuate RF signals between 2.4 GHz and 2.5 GHz (i.e. noise in the WiFi band) by several orders of magnitudes.

In the reception path(s) (RX1, RX2), referring to FIG. 3D, reception RF signals received by antenna 1, 2 can include both cellular band signals and WiFi band noise. The reception RF signals are directed by the switches 382 and 384 to the antenna filters 354 and 364. The antenna filters 354, 364 can reject the RF signals outside of 2.3 to 2.7 GHz range to minimize receiver jamming. The broadband amplifiers 350 and 360 respectively amplify the reception RF signals in the broadband to produce amplified reception RF signals. The broadband amplifiers 350, 360 have broad gain profiles spanning from 2.3 GHz to 2.7 GHz (shown in FIG. 4A), which covers the range of multiple cellular Bands 7, 38, 40, 41, and the WiFi band shown in FIG. 1A. In some implementations, the broadband amplifiers 350, 360 can have broader gain profiles spanning from 2.0 GHz to 2.7 GHz which also covers additional Band 34. The coexist filters 352, 362 subsequently filter out the WiFi band noise in the range from 2.4 GHz to 2.5 GHz in the amplified reception RF signals. The filtered and amplified reception RF signals are further filtered by the interstage filters 356, 366.

The coexist filters 320, 352, 362 can effectively eliminate extraneous RF noise in the WiFi band before the noises get transmitted or received, which enables high quality cellular (e.g. 4G and 3G) transmissions in coexistence with WiFi communications on the same mobile device.

Figure 5A:
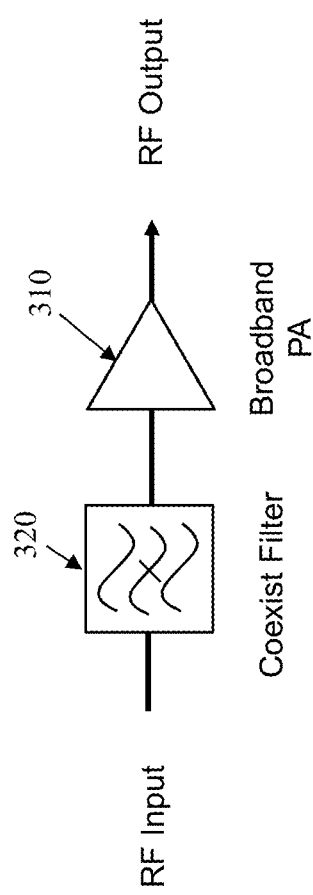
FIG. 5A shows a portion of the RF amplifier circuit having a notch type coexist filter in FIG. 3C.
Figure 5B:
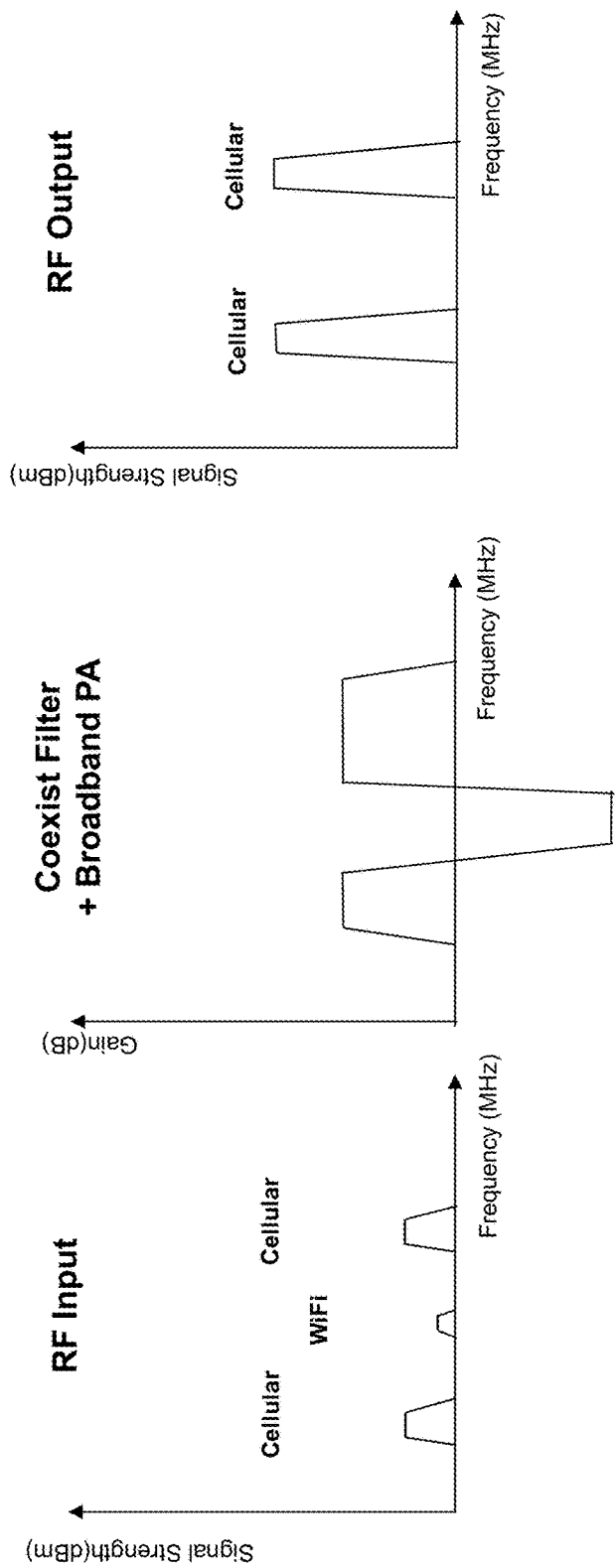
FIG. 5B illustrates the coexist-filter attenuation profile and broadband PA profile of the broadband RF amplifier in FIG. 5A.

FIG. 5A shows a portion of the multimode multiband wireless device 300 in FIG. 3C, which includes a broadband power amplifier 310 and a notch type coexist filter 320. The coexist-filter attenuation profile and broadband PA profile of the broadband amplifier are illustrated in FIG. 5B. FIG. 5B illustrates, on the left side, intended input signals in two cellular bands, and interfering noise from a WiFi band between the two cellular bands. The coexist filter 320 is implemented as notch type which has an attenuation profile, shown in the middle, that rejects the noise in WiFi band. The resulting output profile on the right side span only the two intended cellular bands.

Figure 5C:
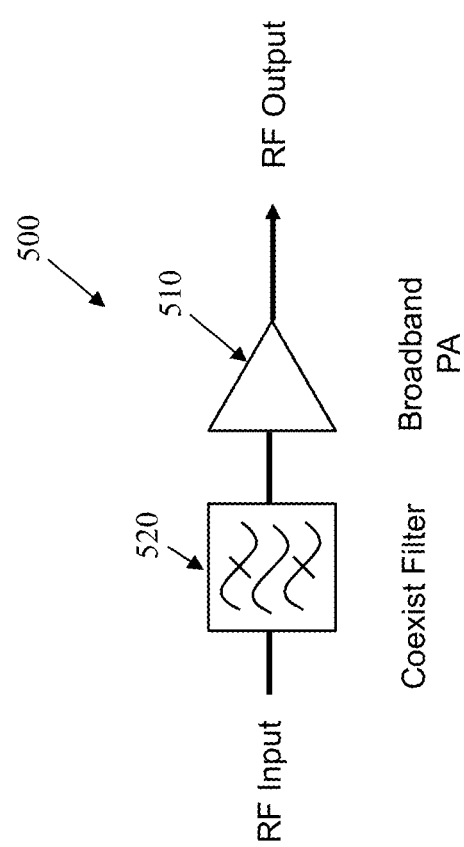
FIG. 5C shows a portion of the RF amplifier circuit having a band-pass type coexist filter.
Figure 5D:
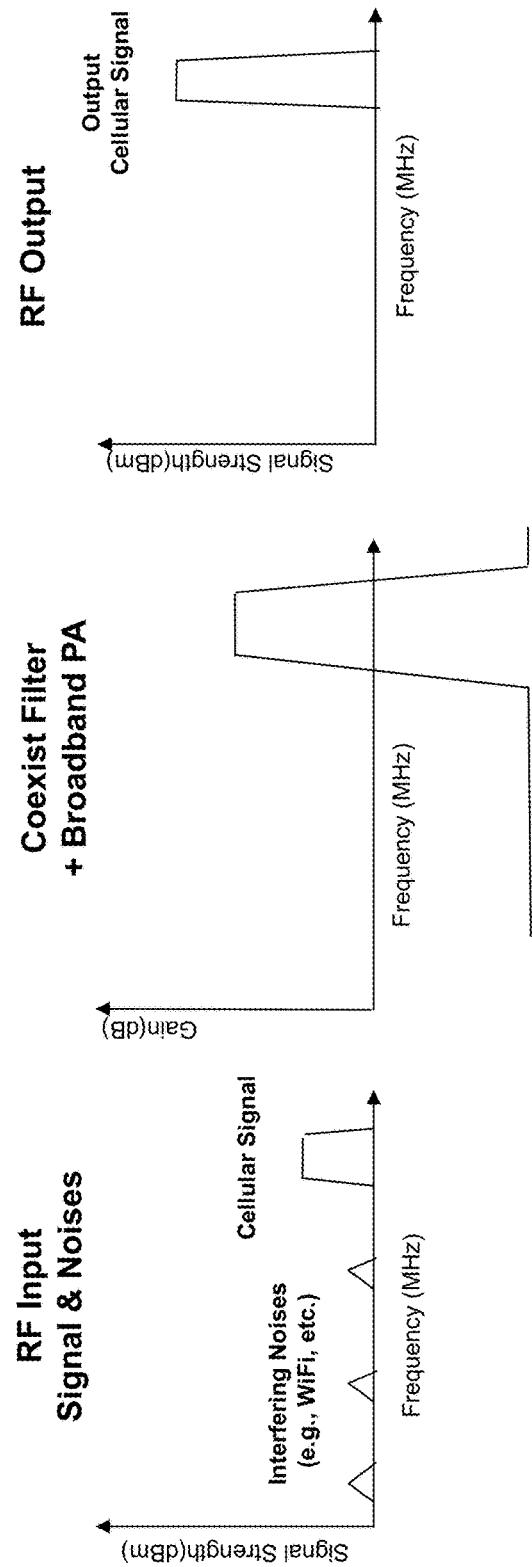
FIG. 5D illustrates the band-pass type coexist-filter profile and broadband PA profile of the broadband RF amplifier in FIG. 5C.

FIG. 5C shows a portion of the broadband amplifier circuit 500 having a broadband power amplifier 510 and a band-pass type coexist filter 520. The band-pass type coexist-filter profile and broadband PA profile of the RF amplifier circuit 500 are shown in FIG. 5D. FIG. 5D illustrates on the left side an input signal in an intended cellular band, and interfering noises from WiFi, GPS, DTV, digital TV, digital video broadcasting, or FM radio band adjacent to the cellular band. The coexist filter 320 is implemented as band-pass type which has an attenuation profile, shown in the middle, that rejects the noise in WiFi, GPS, SDARS, Bluetooth, DTV, TV or radio band, which results in an output profile (on the right side) only in the intended cellular band.

In some embodiments, the multimode multiband wireless device 300 including the inter-stage filters 340, 356, 366, the coexist filters 320, 352, 362, the broadband power amplifier 310, the broadband amplifiers 350, 360, the antenna filters 330, 354, 364, and the switches 380-384 can be implemented on a multi-chip package to achieve compact size and to reduce costs.

Figure 6:
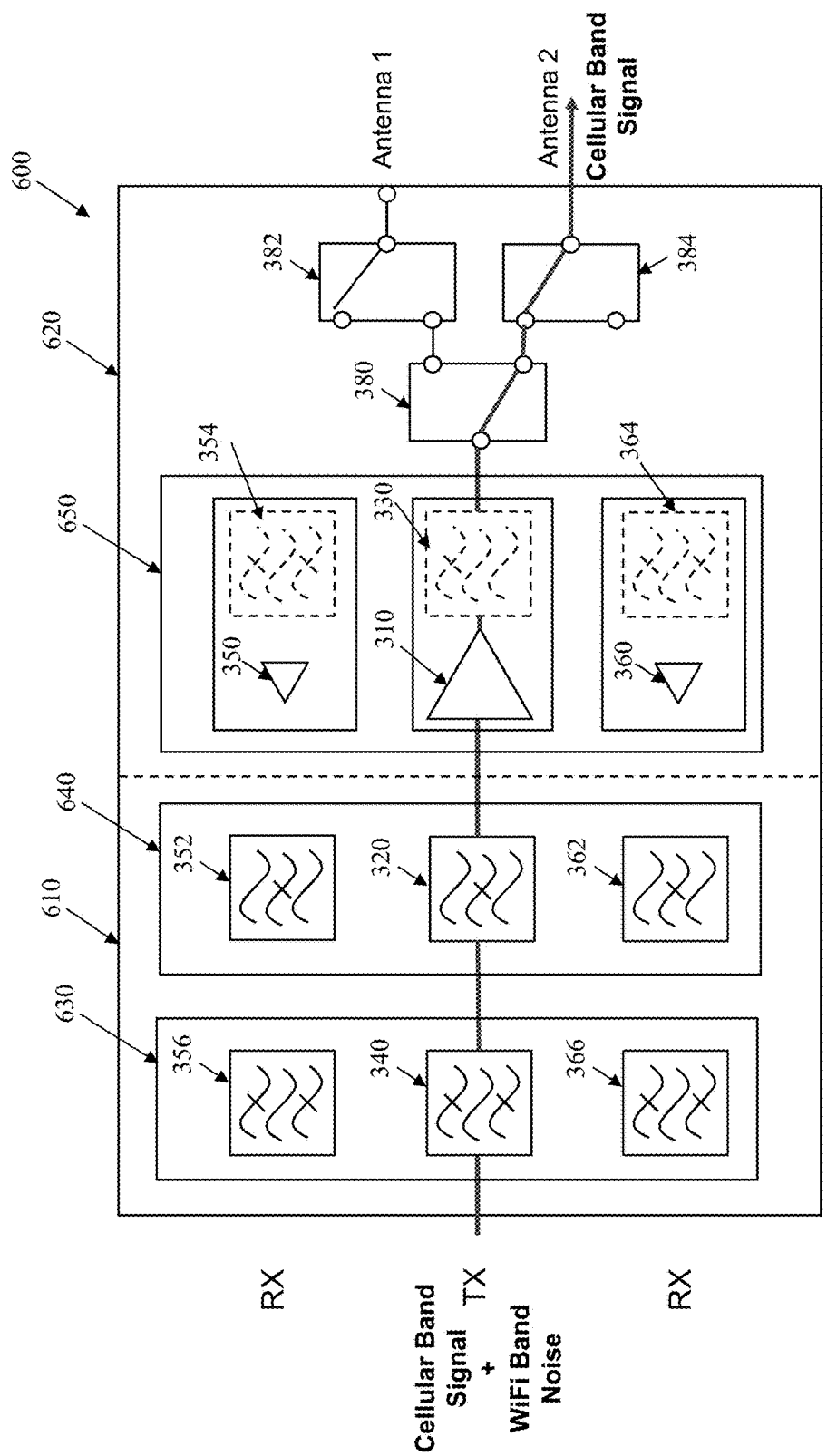
FIG. 6 shows an implementation of an RF amplifier circuit on multiple dies in accordance with the present invention.

In some embodiments, referring to FIG. 6, in a multimode multiband wireless device 600, the broadband power amplifier 310 and the broadband amplifiers 350, 360 and their associated antenna filters 330, 354, 364 are fabricated on a semiconductor substrate 650 such as Gallium Arsenside (GaAs). The inter-stage filters 340, 356, 366 can be implemented on another semiconductor substrate 630. The coexist filters 320, 352, 362 can be implemented on another semiconductor substrate 640. The switches 380-384 can be implemented on another semiconductor substrate.

An advantage of the above described multi-substrate configuration is that only the semiconductor substrate 640 comprising the coexist filters need to be changed to support different network operators or protocols in different countries. This flexibility can significantly lower cost for manufacturing wireless devices. For example, in the 2.3 to 2.7 GHz range, Band 38 is used in the E.U, Band 7 is used in the E.U. and Latin America, Band 40 is used in China and India, and Band 41 is used in the U.S. Semiconductor substrates 640 comprising different coexist filters can be used for different regions.

In some embodiments, still referring to FIG. 6, the inter-stage filters 340, 356, 366 and the coexist filters 320, 352, 362 can be fabricated on a semiconductor substrate 610, whereas the broadband power amplifier 310, the broadband amplifiers 350, 360, the antenna filters 330, 354, 364, and the switches 380-384 can be implemented on another semiconductor substrate 620.

Figure 1B:
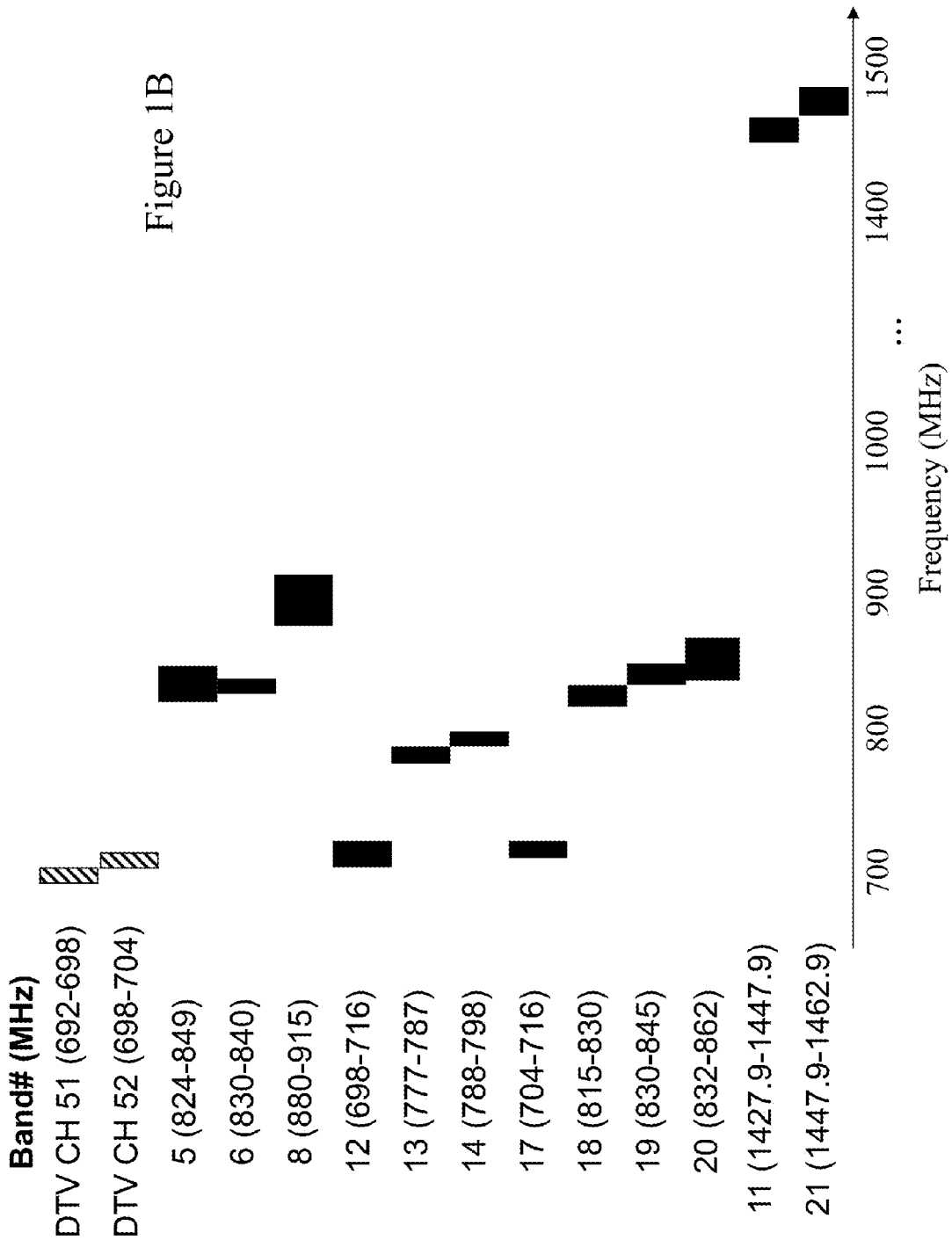
FIG. 1B is a schematic diagram illustrating DTV bands and cellular bands uplink frequency in the 0.7-1.5 GHz range.

The above described multimode multiband wireless devices are compatible with other RF frequency ranges. Different amplifier circuits can be used to cover frequencies ranging from 700 MHz to 3800 GHz. For example, a broadband power amplifier circuit can amplify RF signals in cellular bands from 698 MHz to 915 MHz (herein referred as 1 GHz PA) without interferences with the DTV CH 51 and 52, as shown in FIG. 1B. The coexist filter attenuates noise in the operation frequency range of DTV CH 51 and 52 (692-698 MHz and 698-704 MHz).

Another power amplifier circuit can cover the frequency range from 1427.9 to 1462.9 MHz (herein referred as 1.5 GHz PA), which includes Band 11 (1427.9-1447.9 MHz) and Band 21 (1447.9-1462.9 MHz), as shown in FIG. 1B.

Figure 1C:
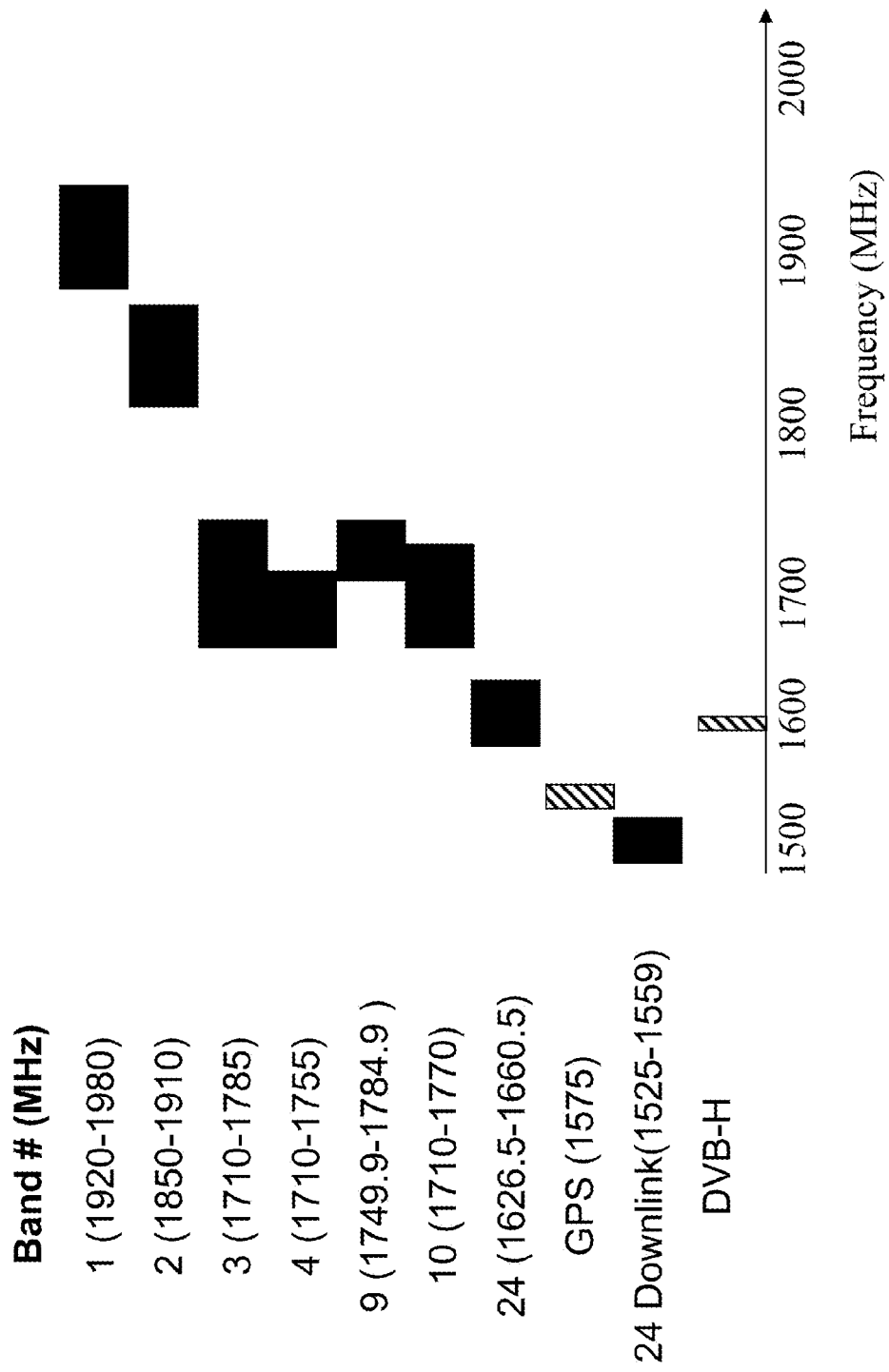
FIG. 1C is a schematic diagram illustrating a GPS band, a DTV band, and cellular bands uplink frequency and band 24 downlink frequency in the 1.5-2.0 GHz range.

Another power amplifier circuit can amplify cellular RF signals in cellular bands in the frequency range from 1710-1980 MHz or 1626-1980 MHz (herein referred as 2 GHz PA) without interferences with GPS, DVB-H, etc., as shown in FIG. 1C. The coexist filter attenuates noise in the operation frequency range of GPS, DVB-H, etc.

Figure 1D:
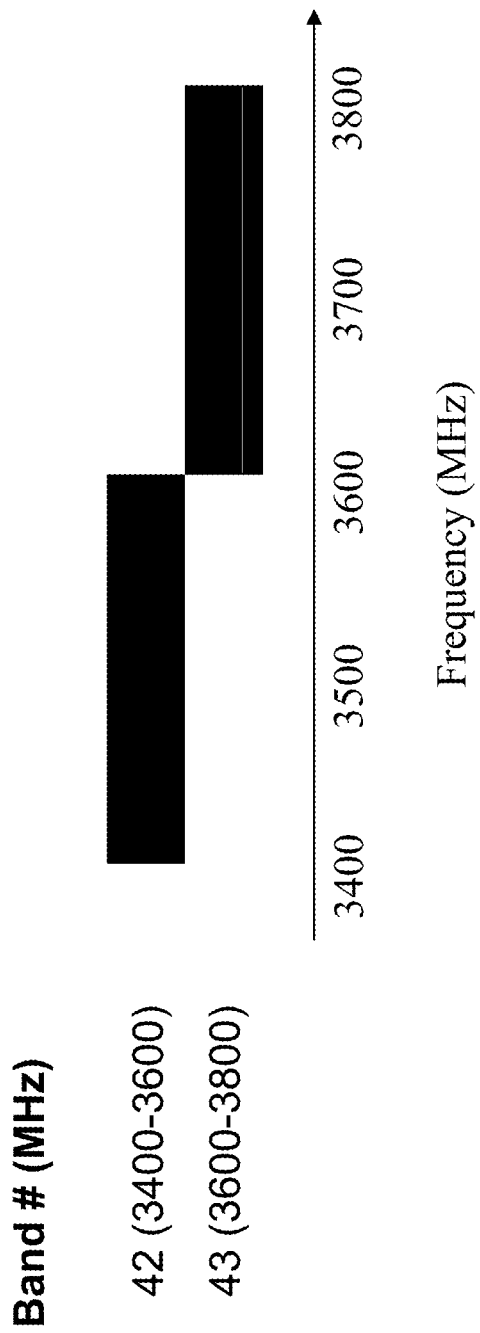
FIG. 1D is a schematic diagram illustrating cellular bands operating in the 3.4-3.8 GHz range.

Still another power amplifier circuit can cover the frequency range from 3400 to 3800 MHz (herein referred as 3.5 GHz PA), which includes Band 42 (3400-3600 MHz) and Band 43 (3600-3800 MHz), as shown in FIG. 1D.

Figure 7:
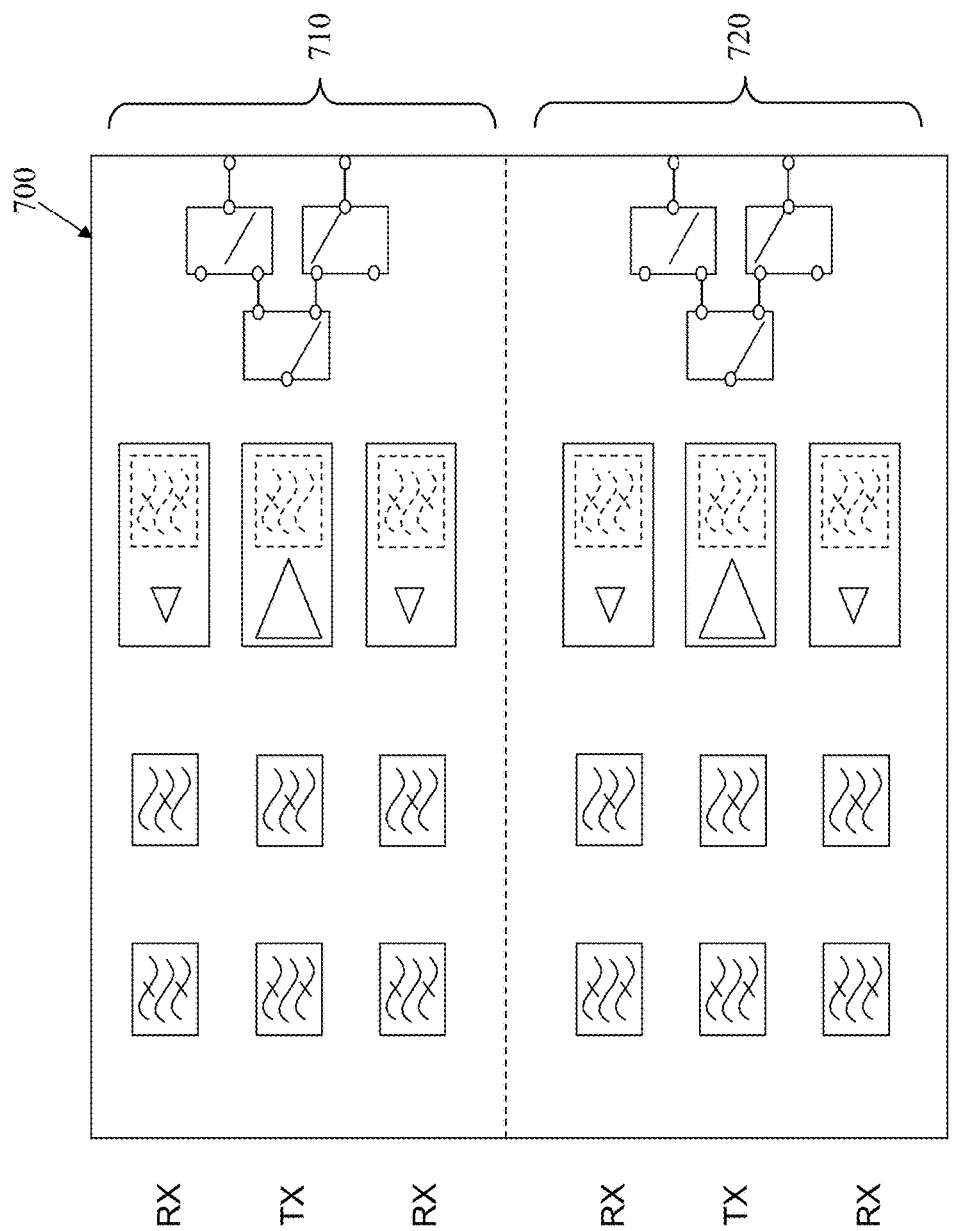
FIG. 7 shows multiple RF amplifier circuits aggregated on a single substrate in accordance with the present invention.

A multimode multiband wireless device can provide carrier aggregation. For example, a 1 GHz PA can amplify RF signals in both Band 13 and Band 5 at the same time. Referring to FIG. 7, multiple broadband amplifier circuits 710, 720 can be included in a multimode multiband wireless device 700 in a single wireless device and/or integrated on a single substrate. For example, the multimode multiband wireless device 700 can include the broadband amplifier circuit as a 1 GHz PA and the broadband amplifier circuit as a 2 GHz PA, which together can provide RF amplifications for Band 1 and Band 13 at the same time. In another example, an aggregated broadband amplifier circuit can contain a 1 GHz PA, a 1.5 GHz PA, and a 2 GHz PA, which can provide power amplification for cellular bands residing in the different frequency ranges.

Figure 8A:
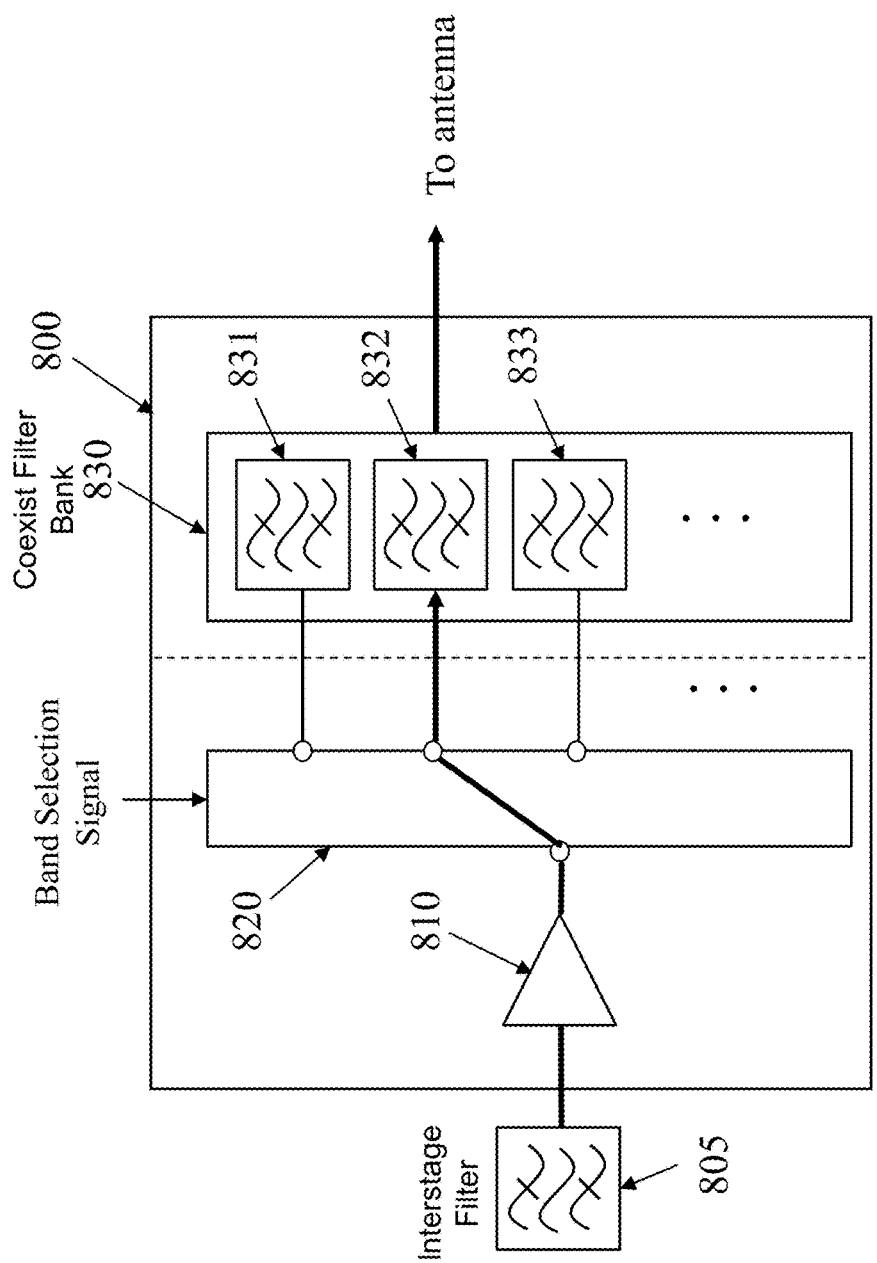
FIG. 8A shows the transmission of wireless signals in an RF power amplifier circuit based on multiplexing coexist filters in accordance with the present invention.
Figure 8B:
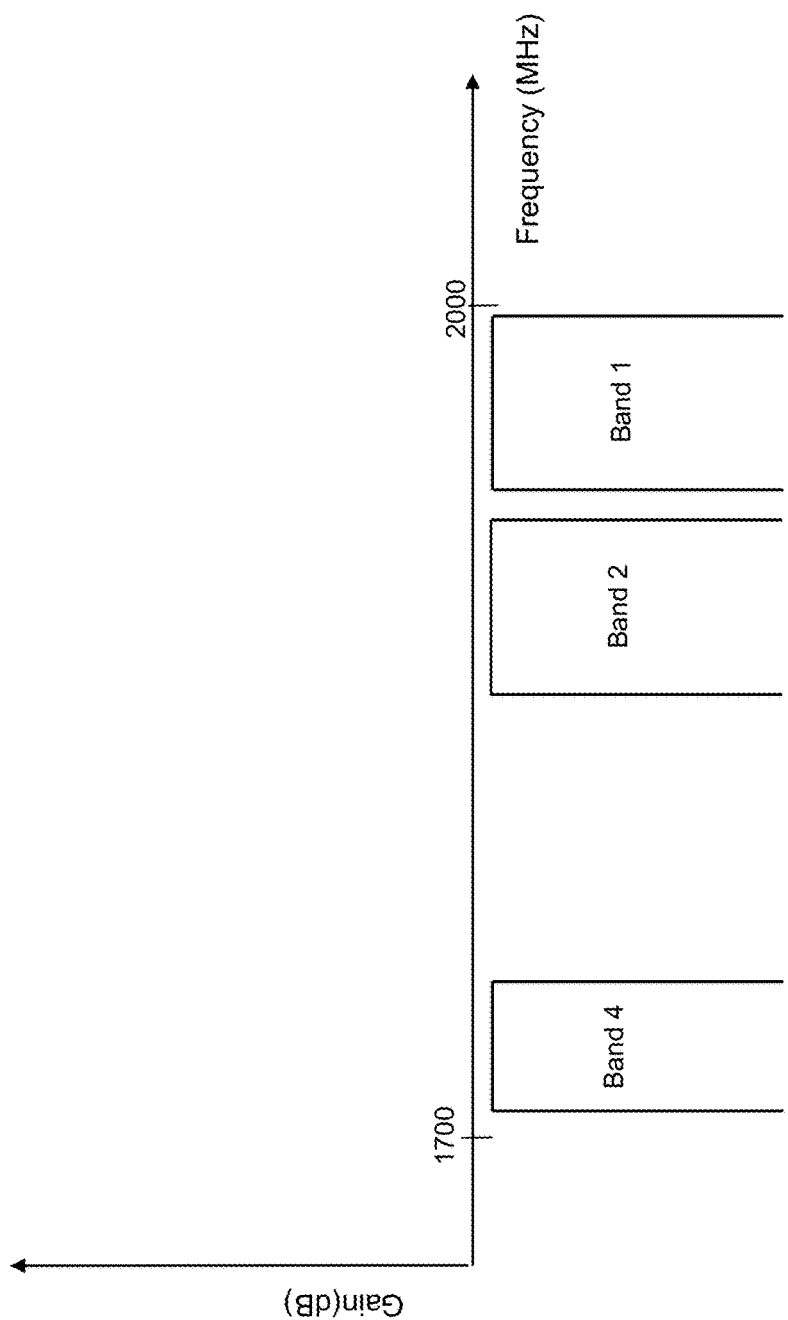
FIG. 8B shows exemplified attenuation profiles of the coexist filters in the RF power amplifier circuit shown in FIG. 8A.

In some embodiments, referring to FIG. 8A, a multimode multiband wireless device 800 includes an interstage filer 805, a broadband power amplifier 810, a switch 820, and coexist filters 831-833 each of which passes RF signals in a different cellular band. The switch 820 can be a multiplexer. For example, the multimode multiband wireless device 800 can be a 2 GHz broadband PA covering the range from 1710 to 1980 MHz. The coexist filters 831-833, as shown in FIGS. 8B and 1C, can respectively pass in the Band 4 (1710-1755 MHz), Band 2 (1850-1910 MHz), and Band 1 (1920-1980 MHz). Transmission RF signals are amplified by the broadband power amplifier 810. The coexist filters 831-833 can effectively attenuates noise from GPS and DVB-H bands and other noise outside of frequency of the selected band. The amplified transmission RF signals are directed to one of the coexist filters 831-833 by the switch 820 under the control of a band selection signal. For example, the amplified transmission RF signals are directed through the coexist filter 832 and then to the antenna for wireless transmission.

Figure 8C:
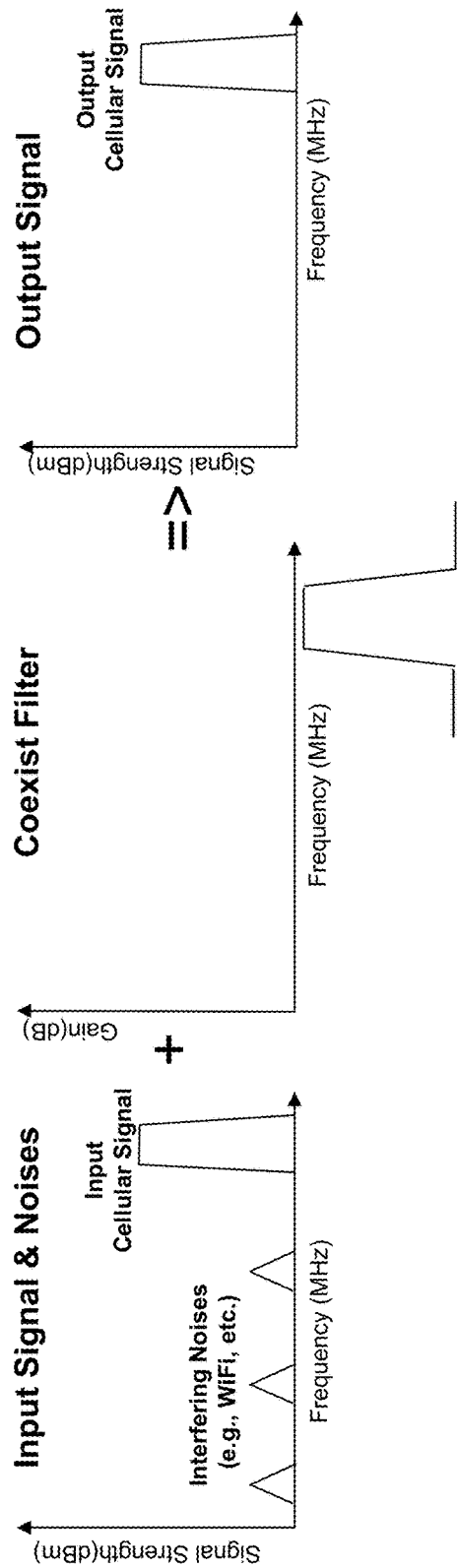
FIG. 8C illustrates the amplifier output signal and the band pass profile of the RF amplifier circuit in FIG. 8A.

FIG. 8C illustrates the amplifier output signal and the band pass profile of the broadband power amplifier 810 in FIG. 8A. FIG. 8C shows on the left side, an intended input cellular signal in a cellular band, and interfering noises from WiFi, GPS, DTV, TV or radio band adjacent to the cellular band. The band-pass type coexist filter 831, 832, or 833 has a profile (shown in the middle) that passes the signals in one of the intended cellular bands but attenuates interfering noise in WiFi, GPS, DTV, TV, or FM radio band, which results in the output profile signal only in the intended cellular band, as shown on the right side.

Figure 9A:
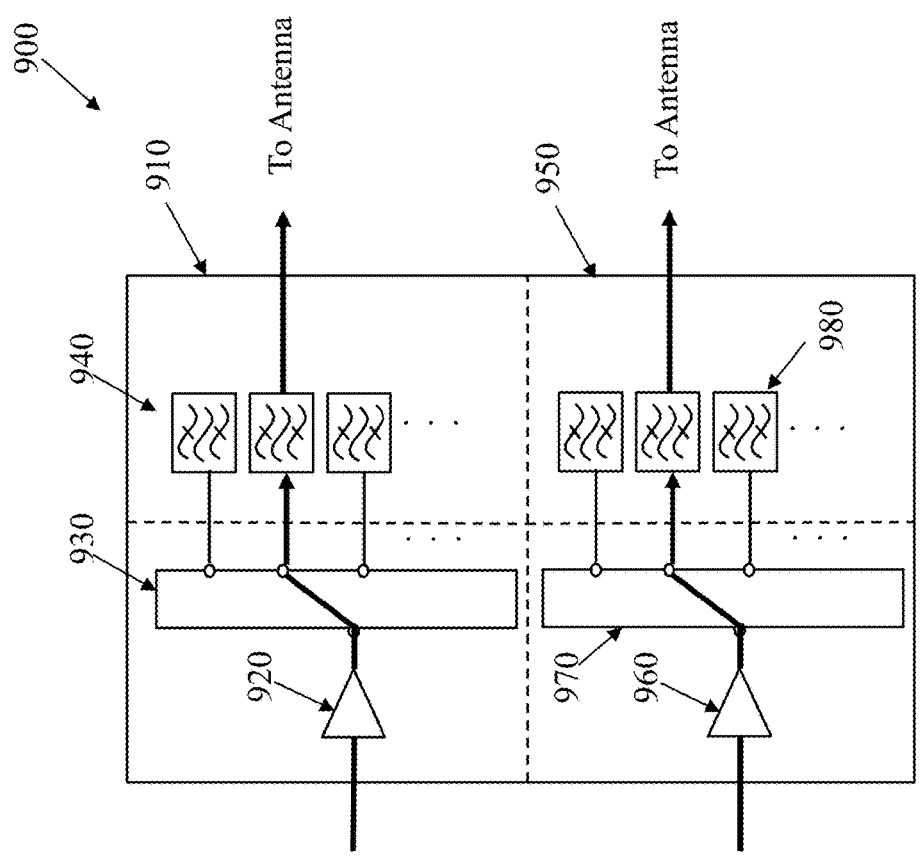
FIG. 9A shows multiple RF power amplifier circuits based on multiplexing coexist filters in a single device in accordance with the present invention.

An advantage of the multimode multiband wireless device 800 is that it can be implemented with reduced cost by adopting broadband power amplifier which reducing the number of power amplifiers required by multiband cellular service. In some embodiments, referring to FIG. 9A, a multimode multiband wireless device 900 with even more bands can be integrated with multiple broadband RF power amplifier circuits 910, 950 based on multiplexing coexist filters. The broadband RF power amplifier circuit 910 includes a broadband power amplifier 920, a multiplexer 930, and coexist filters 940. The broadband RF power amplifier circuit 950 includes a broadband power amplifier 960, a multiplexer 970, and coexist filters 980. The broadband RF power amplifier circuits 910, 950 can function like the multimode multiband wireless device 700 as described above. The multimode multiband wireless device 900 can provide carrier aggregation across different frequency ranges. For example, the broadband RF power amplifier circuit 910 can be a 2 GHz broadband PA covering the range from 1710 to 1980 MHz or 1626 to 1980 MHz. The broadband RF power amplifier circuit 950 can be a 1 GHz broadband PA covering the range from 698 MHz to 915 MHz. In wireless operation, the broadband RF power amplifier circuit 910 can be switched to amplify RF signals in Band 2 (1850-1910 MHz), whereas the broadband RF power amplifier circuit 950 can be simultaneously switched to amplify RF signals in Band 13 (777-787 MHz). The frequency ranges listed above for 1 GHz broadband PA, 2 GHz broadband PA are for illustration purpose, and the exact ranges can be modified suitably for the standards of cellular bands which may evolve from time to time.

Figure 9B:
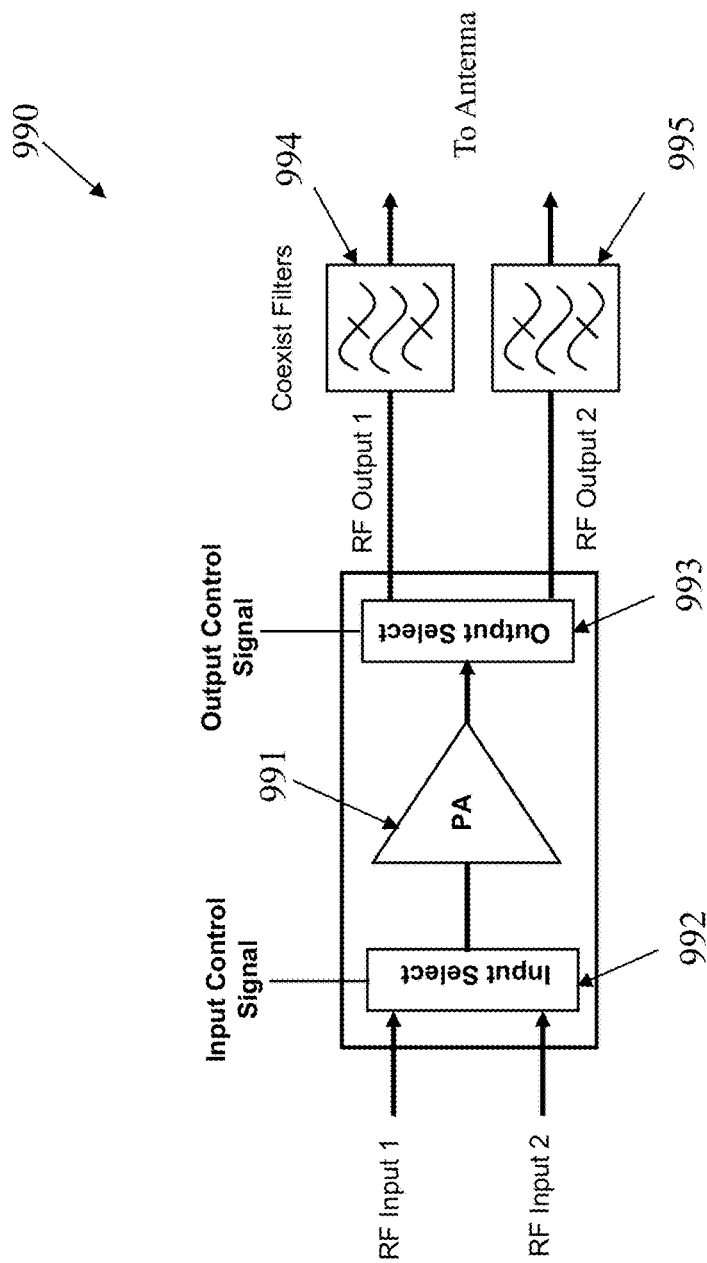
FIG. 9B shows a RF power amplifier circuit including selectable multiple RF input ports and selectable multiple RF output ports and multiple coexist filters in accordance with the present invention.

FIG. 9B shows a RF power amplifier circuit including multiplexing input RF signals and multiplexing coexist filters in accordance with the present invention. A multimode wireless device 990 includes an input select circuit 992 configured to select a plurality of RF input signals such as RF input 1, RF input 2, under the control of input control signal. The RF input signal selected is input to the broadband power amplifier 991. The amplified RF signal is sent to an output select circuit 993, which can direct the amplified RF signal to one of coexist filters 994, 995 in response to an output control signal. Each of the coexist filters 994, 995 is connected to antenna.

The coexist filters 994, 995 have band profiles covering different RF bands. For example, the coexist filter 994 can have a band pass profile spanning a first cellular band. The coexist filter 995 can have a band pass profile spanning a second cellular band. Alternatively, the coexist filter 995 can have a notch profile rejecting the WiFi band, such as from 2400 MHz to 2483 MHz, or other frequency bands such as GPS, SDARS, digital terrestrial television, etc.

It is understood the disclosed multimode multiband wireless devices can be compatible with other variations without deviating from the spirit of the present application. The multi-band filter can be implemented by different components and under different mechanism from the description above. The disclosed multimode multiband wireless devices can operate in frequency ranges and RF bands different the examples used in the specification. The disclosed broadband power amplifier circuits are suitable to various cellular communication standards, such as 2G, 3G, 4G, Long Term Evolution (LTE), TD-LTE, LTE Advanced, WiMax, WiBro, etc. The frequency ranges of broadband PAs are not limited to the frequency range illustrated above and are subject to revision, as the standards of cellular bands may evolve from time to time.

What is claimed is:

1. A radio frequency (RF) power amplifier wireless transmitter device, comprising:
a first semiconductor substrate having a broadband radio frequency (RF) power amplifier configured to simultaneously input a plurality of mobile frequency bands on a single, input transmitter path and to produce simultaneously a plurality of amplified mobile frequency bands on a single, output transmitter path at the single RF output, wherein said plurality of mobile frequency bands are transmitted in a range of 2.3 GigaHertz (GHz) to 2.7 GHz; and
a second semiconductor substrate having a coexist filter coupled to the input of the broadband RF power amplifier and configured to reject frequencies in a range of 2.4 GHz to 2.5 GHz.

2. The wireless transmitter device of claim 1, further comprising: a switch positioned on the output transmitter path side of the broadband RF power amplifier and configured to connect the output transmitter path to a second and a third filter.

3. The wireless transmitter device of claim 1, wherein the first semiconductor substrate includes Gallium Arsenide.

4. The wireless transmitter device of claim 1, further comprising:

a third semiconductor substrate having an inter-stage filter which receives and filters RF signals in a range of 2.3 GHz to 2.7 GHz and is coupled to the broadband RF power amplifier.

5. A radio frequency (RF) power amplifier wireless transmitter device, comprising:
- a first semiconductor substrate having a broadband RF power amplifier configured to simultaneously input a plurality of mobile frequency bands on a single, input transmitter path and to produce simultaneously a plurality of amplified mobile frequency bands on a single, output transmitter path to be transmitted in a range of 2.3 GigaHertz (GHz) to 2.7 GHz; and
- a switch positioned on the output transmitter path side of the broadband RF power amplifier and configured to connect the output transmitter path of the RF power amplifier to a plurality of antennas.

6. The wireless transmitter device of claim 5, further comprising:
- an input select circuit configured to direct the RF signals from one or more input filters to the input transmitter path of the broadband RF power amplifier.

7. The wireless transmitter device of claim 6, wherein the one or more input filters are band-pass filters.

8. The wireless transmitter device of claim 7, wherein the one or more input filters include notch filters.

9. A radio frequency (RF) power amplifier wireless transmitter device, comprising:
- a broadband RF power amplifier configured to simultaneously input a plurality of mobile frequency bands on a single, input transmitter path and to produce simultaneously a plurality of amplified mobile frequency bands on a single, output transmitter path, wherein said plurality of mobile frequency bands are transmitted in a range of 3.4 Gigahertz (GHz) to 3.8 GHz; and
- a coexist filter coupled to the input transmitter path of the broadband RF power amplifier and configured to pass or reject predetermined frequencies of the RF signal.

10. The wireless transmitter device of claim 9, further comprising:
- a second filter positioned on the input transmitter path side of the broadband RF power amplifier; and
- a switch positioned on the output transmitter path side of the broadband RF power amplifier and configured to connect the output transmitter path to at least one of a plurality of antennas.

11. The wireless transmitter device of claim 9, wherein the coexist filter is a notch filter.

12. A method of wirelessly transmitting an RF signal from a radio frequency (RF) power amplifier wireless device comprising:
- simultaneously inputting a plurality of mobile frequency bands on a single, input transmitter path of a broadband radio frequency (RF) power amplifier on a first semiconductor substrate;
- producing simultaneously a plurality of amplified mobile frequency bands on a single, output transmitter path, wherein said plurality of mobile frequency bands are transmitted in a range of 2.3 GigaHertz (GHz) to 2.7 GHz; and
- rejecting frequencies in a range of 2.4 GHz to 2.5 GHz at a coexist filter coupled to the input transmitter path of the broadband RF power amplifier which is located on a second semiconductor substrate.

* * * * *